United States Patent
Yamada et al.

(10) Patent No.: US 6,414,373 B2
(45) Date of Patent: Jul. 2, 2002

(54) SEMICONDUCTOR DEVICE AND METHOD OF FABRICATING THE SAME

(75) Inventors: Hiroaki Yamada; Osamu Fujii, both of Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/887,098

(22) Filed: Jun. 25, 2001

(30) Foreign Application Priority Data

Jun. 26, 2000 (JP) ........................................ 2000-191323

(51) Int. Cl.$^7$ .............................................. H01L 29/167
(52) U.S. Cl. ........................................ 257/611; 438/471
(58) Field of Search ................................ 438/471, 478, 438/491, 508, 509; 257/617, 611, 913

(56) References Cited

U.S. PATENT DOCUMENTS

| | | | |
|---|---|---|---|
| 5,674,756 A | * 10/1997 | Satoh et al. | 437/10 |
| 5,788,763 A | * 8/1998 | Hayashi et al. | 117/2 |
| 6,008,110 A | * 12/1999 | Samata et al. | 438/459 |
| 6,162,708 A | * 12/2000 | Tamatsuka et al. | 438/503 |
| 6,191,009 B1 | * 2/2001 | Tamatsuka et al. | 438/471 |
| 6,222,252 B1 | * 4/2001 | Numano et al. | 257/617 |

FOREIGN PATENT DOCUMENTS

JP 2000-269225 9/2000

OTHER PUBLICATIONS

Abe, T. et al., "Creation of Bonded SOI Substrates CZ Silicon Higher than 1000 Ωcm in Resistivity" Extended Abstracts of the 1999 International Conference on Solid State Devices and Materials. pp. 356–357(1999).

* cited by examiner

*Primary Examiner*—David Nelms
*Assistant Examiner*—Quoc Hoang
(74) *Attorney, Agent, or Firm*—Finnegan, Henderson, Farabow, Garrett & Dunner, L.L.P.

(57) ABSTRACT

A high-resistance substrate with good RF characteristics, which has an interstitial oxygen concentration ([Oi]) of 8E17 cm$^{-3}$ or less, an oxygen precipitate density ([BMD]) of 1E8 cm$^{-3}$ or more, and a substrate resistivity of 500 Ω·cm or more is used. A heat-treating step of the device process is performed for 25 hrs or less as a value calculated assuming that the temperature is 1,000° C. This suppresses a decrease in the resistance of the substrate, prevents crystal defects such as slip, and improves the yield.

6 Claims, 3 Drawing Sheets

|  | RF CHARACTERISTICS | YIELD RATIO | CRYSTAL DEFECTS (SLIP) |
|---|---|---|---|
| EXAMPLE 1 | GOOD | 1.2 | NONE |
| EXAMPLE 2 | GOOD | 1.2 | NONE |
| COMPARATIVE EXAMPLE 1 | GOOD | 1.0 | OCCURRED IN BOAT CONTACT PORTIONS |
| COMPARATIVE EXAMPLE 2 | GOOD | FABRICATION WAS IMPOSSIBLE | OCCURRED ON ENTIRE SURFACE |

FIG.5

SEMICONDUCTOR DEVICE AND METHOD OF FABRICATING THE SAME

CROSS REFERENCE TO RELATED APPLICATION

This application claims benefit of priority under 35 USC 119 to Japanese Patent Application No. 2000-191323, filed on Jun. 26, 2000, the entire contents of which are incorporated by reference herein.

BACKGROUND OF THE INVENTION

The present invention relates to a semiconductor device and a method of fabricating the same and, more particularly, to a device using radio-frequency signals and a method of fabricating the same.

RF (Radio Frequency) communication devices using RF signals are often fabricated by using an SOI (Silicon On Insulator) wafer which uses, as a support substrate, a high-resistance substrate (resistivity $\rho \geq 1,000$ $\Omega \cdot cm$) formed by crystal pulling by the CZ method, in order to suppress energy loss of an RF signal and form a spiral inductance having a high Q value even in the GHz band. This fabrication method improves the RF characteristics.

Unfortunately, if the interstitial oxygen concentration (to be referred to as [Oi] hereinafter) in the semiconductor substrate is high, heat-treating performed during the device process for forming a circuit in the substrate generates oxygen donors and lowers the resistivity of the substrate. Hence, a substrate having a low [Oi] ([Oi]$\leq$8E17 $cm^{-3}$) must be used.

The oxygen concentration can be decreased by (1) crystal pulling by the MCZ method, or (2) heat-treating a substrate having a high [Oi] ([Oi] $\geq$13E17 $cm^{-3}$) to form bulk micro defect (to be referred to as BMD hereinafter) by oxygen precipitation, thereby reducing the concentration of a solid solution of oxygen.

When an RF device is formed using a substrate obtained by method (1) above, however, slip occurs in heat-treating during the device process because the pinning effect of dislocation by a solid solution of oxygen lowers. This is a phenomenon in which, when heat-treating is performed by supporting a semiconductor substrate by a 4-point-supporting boat, cracks and the like occur in portions where the substrate contacts the boat.

When an RF device is formed using a substrate obtained by method (2) above, it is possible to prevent the occurrence of slip in the boat contact portions during heat-treating by the pinning effect of dislocation by oxygen redissolving from BMD. However, thermal stress during the device process forms slip on the entire surface of the substrate.

As described above, it is conventionally impossible to effectively prevent slip in a high-resistance substrate having a low [Oi]. This lowers the yield by defects caused by slip.

SUMMARY OF THE INVENTION

It is, therefore, an object of the present invention to provide a semiconductor device capable of preventing defects caused by slip and improving the yield by using a high-resistance substrate having excellent RF characteristics, and provide a method of fabricating the same.

A semiconductor device of the present invention is a semiconductor device obtained by forming a circuit in a surface portion of a semiconductor substrate, wherein the semiconductor substrate has an interstitial oxygen concentration (to be referred to as [Oi] hereinafter) of 8E17 $cm^{-3}$ or less, an oxygen precipitate density (to be referred to as [BMD] hereinafter) of 1E8 $cm^{-3}$ or more, and a resistivity of 500 $\Omega \cdot cm$ or more.

The circuit can be formed in the surface portion of the semiconductor substrate by a device process including a heat-treating step of 25 hrs or less as a value calculated assuming that the temperature is 1,000° C.

The semiconductor substrate is obtained by performing heat-treating at 500 to 700° C. for 5 hrs or less for a semiconductor substrate having an [Oi] of 8E17 $cm^{-3}$ or less, and a resistivity of 500 $\Omega \cdot cm$ or more, thereby setting [BMD] of 1E8 $cm^{-3}$ or more, and the circuit can be formed in the surface portion of the semiconductor substrate by a device process including a heat-treating step of 25 hrs or less as a value calculated that assuming that the temperature is 1,000° C.

The semiconductor substrate has a [BMD] of 1E8 $cm^{-3}$ or more, which is obtained by doping 1E13 $cm^{-3}$ or more of [N] during crystal pulling, and also has an [Oi] of 8E17 $cm^{-3}$ or less and a resistivity of 500 $\Omega \cdot cm$ or more, and the circuit can be formed in the surface portion of the semiconductor substrate by a device process including a heat-treating step of 25 hrs or less as a value calculated assuming that the temperature is 1,000° C.

A method of fabricating a semiconductor device by forming a circuit by using a semiconductor substrate according to the present invention comprises the step of performing a heat-treating step of a device process for forming the circuit for 25 hrs or less as a value calculated assuming that the temperature is 1,000° C., by using a semiconductor substrate having an [Oi] of 8E17 $cm^{-3}$ or less, a [BMD] of 1E8 $cm^{-3}$ or more, and a resistivity of 500 $\Omega \cdot cm$ or more.

The method can further comprise the step of obtaining the semiconductor substrate by performing heat-treating at 500 to 700° C. for 5 hrs or less for a semiconductor substrate having an [Oi] of 8E17 $cm^{-3}$ or less, and a resistivity of 500 $\Omega \cdot cm$ or more, thereby setting a [BMD] of 1E8 $cm^{-3}$ or more.

The method can further comprise the step of obtaining the semiconductor substrate having a [BMD] of 1E8 $cm^{-3}$ or more, which is obtained by doping 1E13 $cm^{-3}$ or more of [N] during crystal pulling, and also having an [Oi] of 8E17 $cm^{-3}$ or less and a resistivity of 500 $\Omega \cdot cm$ or more.

BRIEF DESCRIPTION OF THE DRAWINGS

FIG. 5 is a view for explaining the RF characteristics, the yield ratio, and the presence/absence of crystal defects in each of Examples 1 and 2 and Comparative Examples 1 and 2.

DESCRIPTION OF THE PREFERRED EMBODIMENTS

As described above, when the [Oi] of a high-resistance substrate is lowered while the substrate resistivity is kept high, slip occurs in boat contact portions during heat-treating, or slip caused by thermal stress occurs on the entire substrate surface.

Figure 2:
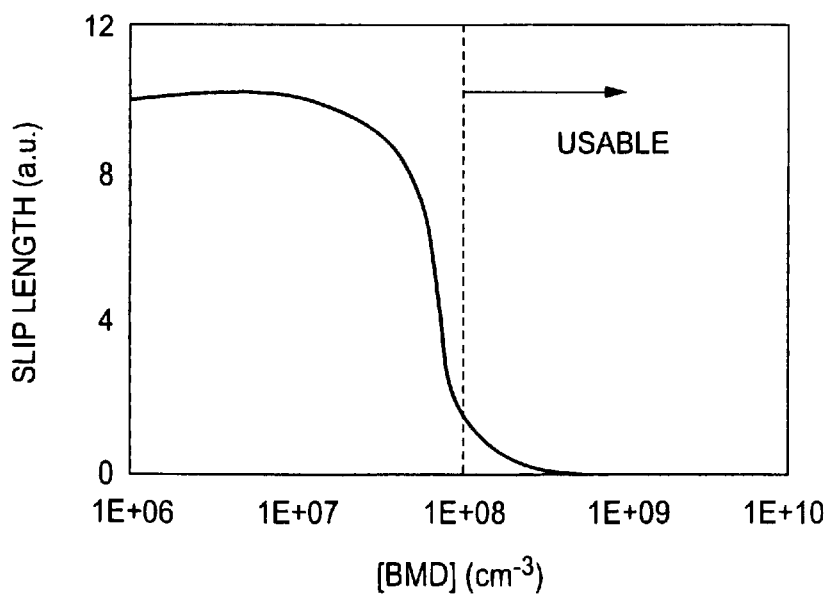
FIG. 2 is a graph showing the relationship between the [BMD] and the slip length.

One countermeasure is a method of forming a predetermined number of BMD or more. FIG. 2 shows the relationship between the density of BMD (to be referred to as [BMD] hereinafter) and the slip length. As shown in FIG. 2, slip can be effectively prevented by a [BMD] of 1E8 cm$^{-3}$ or more.

Oxygen precipitation hardly occurs in a low-[Oi] substrate having an [Oi] of 8E17 cm$^{-3}$ or less. However, BMD can be formed by accelerating oxygen precipitation by, e.g., low-temperature heat-treating at 500 to 700° C. or by introducing $N_2$.

When BMD are formed at high density, the mechanical strength (upper yield stress; σ) sometimes deteriorates to cause slip to frequently occur during the device process.

Figure 3:
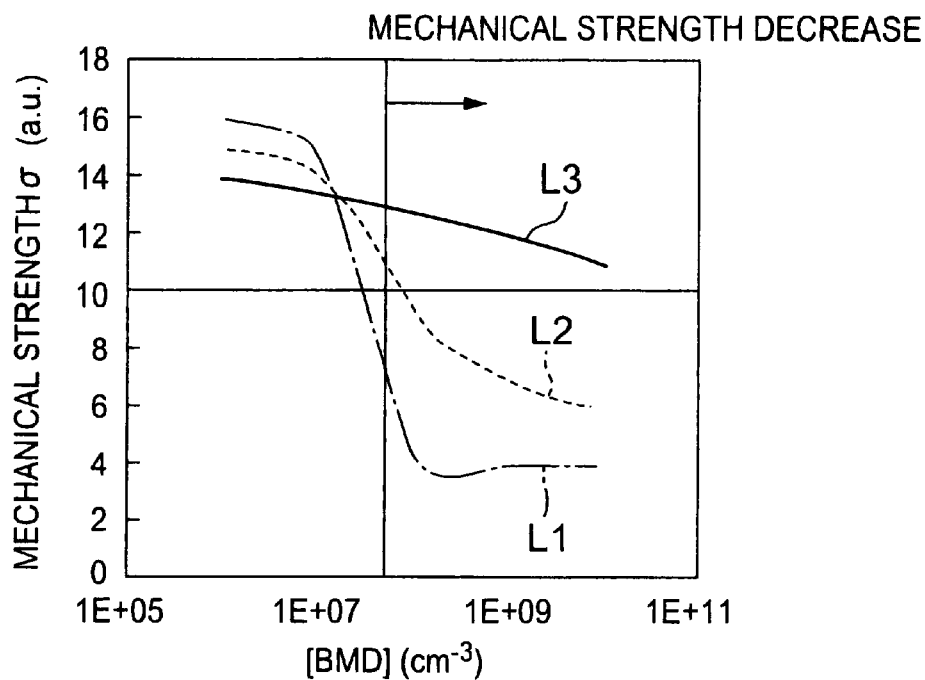
FIG. 3 is a graph showing the relationship between the [BMD] and the mechanical strength.

FIG. 3 shows the dependence of the mechanical strength on the [BMD]. Curves indicated by an alternate long and short dashed line L1, a dotted line L2, and a solid line L3 represent the relationships between the [BMD] and the mechanical strength when the [Oi] is 14E17, 10E17, and 8E17 cm$^{-3}$, respectively.

As is apparent from FIG. 3, the mechanical strength decreases as the [BMD] increases. The higher the [Oi], the more conspicuous the decrease; no large mechanical strength decrease occurs when the [Oi] is low.

Figure 4:
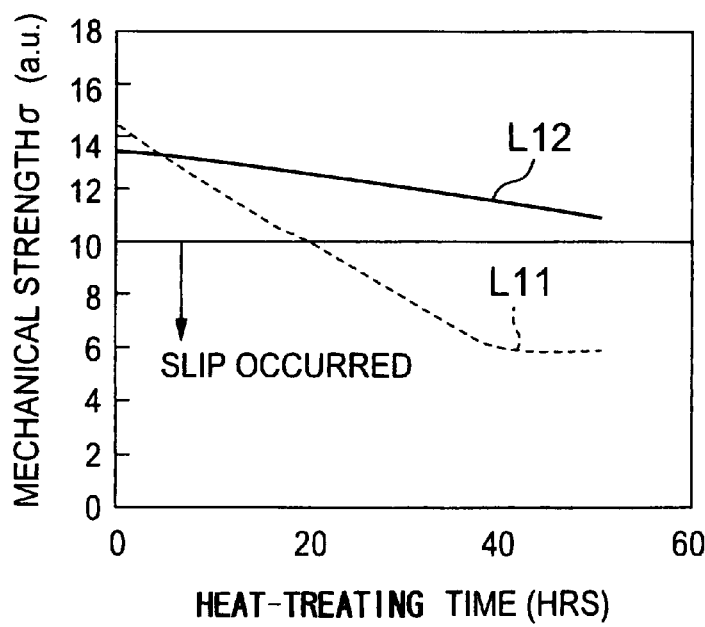
FIG. 4 is a graph showing the relationship between the heat-treating time and the mechanical strength.

FIG. 4 shows the dependence of the mechanical strength on the heat-treating time. Curves indicated by a dotted line L11 and a solid line L12 represent the relationships between the heat-treating time and the mechanical strength when the [Oi] is 14E17 and 8E17 cm$^{-3}$, respectively.

It is evident from FIG. 4 that the mechanical strength decreases as the heat-treating time increases. Also, the higher the [Oi], the more conspicuous the decrease; the mechanical strength does not decrease much when the [Oi] is low. On the basis of FIG. 4, deterioration of the mechanical strength can be prevented by setting the heat-treating time to 25 hrs or less, as a value calculated assuming that the temperature is 1,000° C., during the device process.

Figure 1:
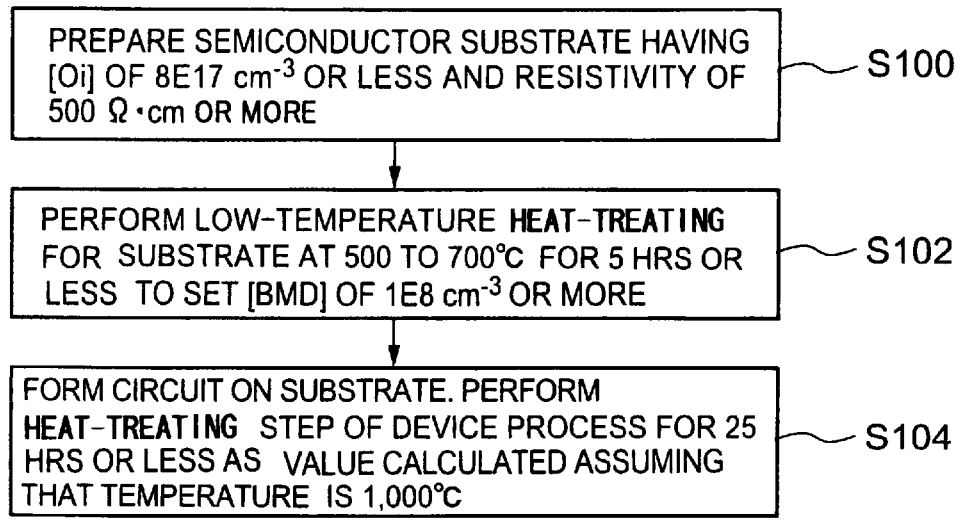
FIG. 1 is a flow chart showing the procedure of a method of fabricating a semiconductor device according to an embodiment of the present invention.

On the basis of the above consideration, in an embodiment of the present invention as shown in FIG. 1, a substrate having a low [Oi] ([Oi]≦8E17 cm$^{-3}$) and a high resistivity (ρ≧500 Ω·cm$^{-3}$) is prepared (step S100). This substrate is subjected to low-temperature heat-treating (500 to 700° C.) for 5 hrs or less to form a predetermined number of BMD or more ([BMD]≧1E8 cm$^{-3}$) (step S102).

To prevent a decrease in the mechanical strength caused by excess growth of BMD in the heat-treating step during the device process, the heat-treating time during the device process is set to 25 hrs or less as a value calculated assuming that the temperature is 1,000° C. (step S104).

BMD can also be formed by introduction of $N_2$ or C, as well as by low-temperature heat-treating.

To perform conversion into the heat-treating time (t) at 1,000° C., the relation ([Oi]–[Oi]E)*(D·t)=constant is used.

In this equation, [Oi] is the concentration of oxygen contained in a substrate before heat-treating, [Oi]E is the supersaturation degree of oxygen, and D is the diffusion constant.

Examples 1 and 2 formed on the basis of the above embodiment and Comparative Examples 1 and 2 corresponding to the conventional techniques will be described below.

(1) EXAMPLE 1

A mirror wafer having a substrate resistivity ρ of 5 kΩ·cm and an [Oi] of 6E17 atoms·cm$^{-3}$ was fabricated by using the MCZ method. This wafer was subjected to low-temperature heat-treating at 600° C. for 6 hrs to obtain 5E8 cm$^{-3}$ of BMD.

This mirror wafer was used as a support substrate to form a thin-film SOI wafer having a silicon thickness (tsi) of 0.2 μm and a buried oxide film thickness (tBOX) of 0.2 μm by using a bonding method.

RF communication devices were formed on this SOI wafer by using an RF BiCOMS process. The heat-treating time of the RF communication devices during the BiCMOS process was set to 15 hrs as a value calculated assuming that the temperature was 1,000° C.

The mechanical strength of the wafer on which these RF devices were formed was evaluated by three-point bending, and found to be 11 MPa at 1,000° C.

(2) EXAMPLE 2

The BMD formation method was different from Example 1 described above; BMD were formed by doping 1E14 cm$^{-3}$ of $N_2$ during crystal pulling. The rest of the fabrication was the same as Example 1, so a detailed description thereof will be omitted.

(3) COMPARATIVE EXAMPLE 1

Unlike Examples 1 and 2 described above, no low-temperature heat-treating for BMD formation was performed. The rest of the fabrication was the same as Examples 1 and 2, so a detailed description thereof will be omitted.

(4) COMPARATIVE EXAMPLE 2

In Example 1 described above, RF communication devices were annealed for 40 hrs, as a value calculated assuming that the temperature was 1,000° C., during the BiCMOS process. The rest of the fabrication was the same as Examples 1 and 2, so a detailed description thereof will be omitted. The mechanical strength of a wafer on which RF communication devices were formed in accordance with Comparative Example 2 was measured and found to be 8 MPa.

The RF characteristics, the yield ratio, and the occurrence of crystal defects (slip) of each of Examples 1 and 2 and Comparative Examples 1 and 2 were examined. The results were as shown in FIG. 5.

All of Examples 1 and 2 and Comparative Examples 1 and 2 had good RF characteristics.

No crystal defects occurred in Examples 1 and 2, and the yield ratios of Examples 1 and 2 were higher by 20% than that of Comparative Example 1.

In Comparative Example 1, crystal defects occurred in the boat contact portions. In Comparative Example 2, crystal defects occurred on the entire surface to make device formation impossible. So, no semiconductor device was completed.

As described above, the results of Examples 1 and 2 show that the above-mentioned embodiment can prevent crystal defects even in the boat contact portions and improve the yield ratio.

That is, it was possible by precipitating 1E8 cm$^{-3}$ or more of BMD to suppress the occurrence of slip even in the boat contact portions, thereby preventing defective devices and improving the yield. As a method of precipitating BMD in a low-[Oi] substrate, it is possible to use the method of performing low-temperature heat-treating for 5 hrs or more as in Example 1, the method of doping $N_2$ as in Example 2, or a method of doping C.

The above embodiment is merely an example and hence does not restrict the present invention. For example, an SOI wafer is used in the above embodiment. However, a bulk wafer having a high resistivity of 500Ω·cm or more can also be used.

As has been described above, a semiconductor device of the present invention can maintain good RF characteristics, prevent crystal defects, and improve the fabrication yield by forming a circuit in a substrate having an [Oi] of $8E17$ cm$^{-3}$ or less, a [BMD] of $1E8$ cm$^{-3}$ or more, and a resistivity of 500 Ω·cm or more. This semiconductor device can be obtained by the fabrication method of the present invention.

What is claimed is:

1. A semiconductor device obtained by forming a circuit in a surface portion of a semiconductor substrate, wherein said semiconductor substrate has an interstitial oxygen concentration (to be referred to as {Oi} hereinafter) of not more than $8E17$ cm$^{-3}$, an oxygen precipitate density (to be referred to as {BMD} hereinafter) of not less than $1E8$cm$^{-3}$, and a resistivity of not less than 500 Ω·cm, wherein said circuit is formed in the surface portion of said semiconductor substrate by a device process including a heat-treating step of not more than 25 hrs as a value calculated assuming that the temperature is 1,000° C.

2. A device according to claim 1, wherein said semiconductor substrate is obtained by performing heat-treating at 500 to 700° C. for not more than 5 hrs for a semiconductor substrate having an {Oi} of not more than $8E17$ cm$^{-3}$, and a resistivity of not less than 500 Ω·cm, thereby setting a {BMD} of not less than $1E8$ cm$^{-3}$.

3. A device according to claim 1, wherein said semiconductor substrate has a {BMD} of not less than $1E8$ cm$^{-3}$, which is obtained by doping not less than $1E13$ cm$^{-3}$ of N during crystal pulling, and also has an {Oi} of not more than $8E17$ cm$^{-3}$ and a resistivity of not less than 500 Ω·cm.

4. A method of fabricating a semiconductor device by forming a circuit by using a semiconductor substrate, comprising the step of performing a heat-treating step of a device process for forming said circuit for not more than 25 hrs as a value calculated assuming that the temperature is 1,000° C., by using a semiconductor substrate having an {Oi} of not more than $8E17$ cm$^{-3}$, a {BMD} of not less than $1E8$ cm$^{-3}$, and a resistivity of not less than 500 Ω·cm.

5. A method according to claim 4, further comprising the step of obtaining said semiconductor substrate by performing heat-treating at 500 to 700° C. for not more than 5 hrs for a semiconductor substrate having an {Oi} of not more than $8E17$ cm$^{-3}$, and a resistivity of not less than 500 Ω·cm, thereby setting a {BMD} of not less than $1E8$cm$^{-3}$.

6. A method according to claim 4, further comprising the step of obtaining said semiconductor substrate having a {BMD} of not less than $1E8$ cm$^{-3}$, which is obtained by doping not less than $1E13$ cm$^{-3}$ of N during crystal pulling, and also having an {Oi} of not more than $8E17$ cm$^{-3}$ and a resistivity of not less than 500 Ω·cm.

* * * * *